United States Patent
DeMeester et al.

(10) Patent No.: US 6,479,999 B1
(45) Date of Patent: Nov. 12, 2002

(54) EFFICIENTLY SHIELDED MRI GRADIENT COIL WITH DISCRETELY OR CONTINUOUSLY VARIABLE FIELD OF VIEW

(75) Inventors: Gordon D. DeMeester, Wickliffe, OH (US); Michael A. Morich, Mentor, OH (US); Shmaryu M. Shvartsman, Highland Heights, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/874,773

(22) Filed: Jun. 5, 2001

(51) Int. Cl.[7] ................................................. G01V 3/00
(52) U.S. Cl. ........................ 324/318; 324/309; 324/319
(58) Field of Search ................................. 324/318, 309, 324/308, 307, 319, 313; 335/216, 301

(56) References Cited

U.S. PATENT DOCUMENTS

| | | | |
|---|---|---|---|
| 4,978,920 A | 12/1990 | Mansfield et al. | 324/318 |
| 5,311,135 A | 5/1994 | Vavrek et al. | 324/318 |
| 5,349,297 A | 9/1994 | DeMeester et al. | 324/318 |
| 5,736,858 A * | 4/1998 | Katznelson et al. | 324/318 |
| 6,025,715 A * | 2/2000 | King et al. | 324/309 |
| 6,049,207 A | 4/2000 | Petropoulos | 324/318 |

OTHER PUBLICATIONS

Kimmlingen et al., "Gradient system with continuously variable field characteristics," Proceedings of the ISMRM, Denver, Apr. 2000.

U.S. Application Ser. No. 09/813,183, Filed Mar. 20, 2001, MRI Gradient Coil with Variable Field of View and Apparatus and Methods Employing the Same.

* cited by examiner

Primary Examiner—Edward Lefkowitz
Assistant Examiner—Brij B. Shrivastav
(74) Attorney, Agent, or Firm—Fay, Sharpe, Fagan, Minnich & McKee, LLP

(57) ABSTRACT

A gradient coil assembly generates magnetic field gradients across the main magnetic field of a magnetic resonance imaging apparatus and includes a primary gradient coil (22p) switchable between a first configuration which generates magnetic field gradients which are substantially linear over a first useful imaging volume, and a second configuration which generates magnetic field gradients which are substantially linear over a second useful imaging volume. A first shield coil set ($22s_1$) is complimentary to the primary gradient coil in one of the first and second configurations, and a second shield coil set ($22s_2$), when either used alone or in combination with the first shield coil, is complimentary to the other of the first and second configurations.

22 Claims, 8 Drawing Sheets

EFFICIENTLY SHIELDED MRI GRADIENT COIL WITH DISCRETELY OR CONTINUOUSLY VARIABLE FIELD OF VIEW

BACKGROUND OF THE INVENTION

The present invention relates to the magnetic resonance arts. It finds particular application in conjunction with medical magnetic resonance imaging and will be described with particular reference thereto. It is to be appreciated, however, that the invention also finds application in conjunction with other types of magnetic resonance imaging systems, magnetic resonance spectroscopy systems, and the like.

In magnetic resonance imaging, linear magnetic field gradients are used for spatial encoding. Gradient coils are used to produce the linear magnetic field gradients. Gradient coils are generally designed to provide an imaging field-of-view (FoV) that is fixed in size. For example, in whole-body applications the gradient coil will typically be designed to produce sufficiently linear or uniform magnetic field gradients over a 50 cm diameter spherical volume (DSV). For a dedicated cardiac scanner, however, the DSV may be 35 cm. For a dedicated head system the linear gradients would typically be designed to produce sufficiently linear magnetic field gradients over a 25 cm DSV. Of course, some models of scanner are designed with slightly larger or smaller DSVs. As the useful DSV is made smaller, the stored energy of the gradient coil is reduced, which allows for higher performance, namely, higher peak gradient strengths and faster gradient coil switching. Outside the substantially linear region of the gradient field (i.e., the "useful" DSV), and to a lesser extent within, the magnetic field gradients produce image distortion. Software-based distortion correction schemes have been developed to correct for non-uniformities within the useful DSV, as well as to expand somewhat the useful imaging FoV beyond the linear region.

In each dedicated case noted above, the gradient coil is generally a unique electromechanical structure and gradient coils with a defined DSV are known and utilized throughout the industry. For example, the most common is a self-shielded symmetric gradient coil design for whole-body imaging applications. Dedicated head and cardiac/head coil designs have emerged to enhance performance (peak strength and switching rate) over a reduced imaging DSV. Generally, body access is desirable for patient comfort reasons, although dedicated head gradient designs continue to be discussed for advanced neuro/brain research applications.

Gradient coils are heavy electromechanical devices, unlike most RF surface coils, which can be easily removed and replaced with different RF coils between imaging procedures (except for body RF transmit coils, which are typically fixed in the imaging system). A gradient coil, due to its high power nature and the high forces created when it is energized, is firmly fixed within an MRI system. As such, a dedicated gradient coil tends to make the MRI system a dedicated imaging system, limiting its scope of clinical application. Thus, accommodating both large and small FoV applications has generally required either separate dedicated machines, which is expensive, or the use of dedicated insertable coils for the smaller volumes, which are heavy and difficult to insert or replace.

More recently, dual or twin gradient designs have been described in the literature that attempt to combine both large volume and high-performance small volume imaging capabilities into a single gradient coil electromechanical package. Katznelson et al., in U.S. Pat. No. 5,736,858, describe a means for providing two gradient coils, which can be configured to allow for two different useful DSVs. Each gradient axis, x, y, and z, has two gradient coil sets. One gradient coil set is designed to produce a linear magnetic field gradient over a first DSV, and a second gradient coil set is designed to produce a second linear magnetic field gradient, such that when the second gradient coil is driven in series with the first gradient coil, there results a second DSV that is larger than the first DSV. In this scheme, the DSV can take two discrete values but is not continuously variable. The first gradient coil has lower stored energy and can be switched faster than the second gradient coil alone or when the two gradient coils are connected in series. In another embodiment, the first coil produces a gradient for use in small FoV applications and the second coil produces a gradient for use in conventional, large FoV applications and a single amplifier means and a switching means allows for one or the other coil to be used separately. In the preferred embodiment, the first coil is used for fast-switching, small FoV imaging and both coils together are used for larger FoV imaging and/or to produce very high gradient strengths, which may find use in diffusion imaging applications. A key point is that each coil is designed so as to produce, alone or in combination, a linear gradient magnetic field over one of two possible imaging DSVs. In the preferred embodiment the two coils are used together (in series) to produce a relatively large DSV. In the alternate embodiment, each coil can be used individually to create reasonably non-distorted magnetic resonance images over two differently sized DSVs. Each coil is self-shielded or actively-shielded in design to minimize eddy current effects. A drawback of this approach is that two full-power gradient coils are layered within one electromechanical assembly. This consumes a great deal of radial space, particularly when the two coils occupy different radial positions within the electromechanical structure. Since the delivered power increases with $R^5$, even a small increase in gradient coil diameter has significant power ramifications. Also, cooling of the two coils becomes an issue, as does the ability to fit in other components such as passive and electrical shim coils.

It has also been proposed by Kimmlingen et al. ("Gradient system with continuously variable field characteristics," ISMRM 2000 (April, 2000, Denver meeting)) to take a standard whole body coil with a large field of view and identify a subset of the primary coil windings that would produce a linear gradient in a smaller FoV, but with comparable (about 20% less) peak gradient strength and substantially lower inductance (about 45% less), allowing for faster gradient switching. A generally corresponding subset of the shield was also selected analogously. A switching means or a dual amplifier design, to feed both coil sections separately, would be provided such that either the subset or all of the windings could be utilized, and the amount of current to subset or other windings could be adjustable, depending on the size of the FoV. The primary advantage is that the primary and shield coils occupy the same radial position with the normal six layers, making cooling and construction easier and more cost-effective. A disadvantage of this approach is that when some of the coil windings were taken away to provide for the smaller FoV, some gradient strength was lost. Another disadvantage is that shielding is compromised since only the combined coils were optimally shielded, leading to increased eddy current effects.

Petropoulos, in U.S. Pat. No. 6,049,207, describes a dual gradient coil assembly with two primary coils and one common shield coil. Each primary coil produces a linear magnetic field gradient over differently sized DSVs when operated with the common shield coil. The residual eddy current effects are not equal for the two coils; one inevitably is better than the other. However, this is minimized by constraining each continuous current primary coil and common shield coil combination to have an integer number of turns before discretization. The approach of having one common shield does save some radial space for manufacture. However, two high power primary coils are still required.

The present invention contemplates a new and improved gradient coil system which provides a selectively or continuously variable imaging field of view, and which overcomes the above-referenced problems and others.

SUMMARY OF THE INVENTION

In a first aspect of the present invention, a magnetic resonance imaging apparatus includes a main magnet system for generating a main magnetic field through an examination region, a radio frequency coil disposed adjacent the examination region for transmitting radio frequency signals into the examination region and selectively exciting dipoles disposed therein, and a radio frequency transmitter for driving the radio frequency coil. A receiver receives magnetic resonance signals from resonating dipoles within the examination region and an image processor reconstructs an image representation from the received magnetic resonance signals for display on a human readable display.

The apparatus further includes a gradient coil assembly for generating magnetic field gradients across the main magnetic field. The gradient coil assembly includes a primary gradient coil set disposed about the examination region including an array of conductive coil loops, which are switchable between first and second configurations. In the first configuration, a current flowing thereon generates magnetic field gradients, which are substantially linear over a first useful imaging volume. In the second configuration, a current flowing therein generates magnetic field gradients, which are substantially linear over a second useful imaging volume, which is smaller than the first. The gradient coil assembly further includes a first shielding coil set disposed about the primary coil set. The first shielding coil set includes an array of conductive coil loops arranged such that a current flowing thereon substantially shields a fringe field from the primary coil set when the primary coil set is operating in the first configuration. A second shielding coil set disposed about the primary coil set includes an array of conductive coil loops arranged such that a current flowing thereon substantially shields a fringe field from the primary coil set when the primary coil set is operating in the second configuration.

In another aspect, a gradient coil assembly for inducing magnetic field gradients across an examination region in a magnetic resonance imaging apparatus is provided. The gradient coil assembly includes a primary gradient coil set disposed about the examination region including an array of conductive coil loops, which are switchable between a first configuration in which a current flowing thereon generates magnetic field gradients, which are substantially linear over a first useful imaging volume and a second configuration in which a current flowing thereon generates magnetic field gradients, which are substantially linear over a second useful imaging volume, which is smaller than the first. A first shielding coil set is disposed about the primary coil set and includes an array of conductive coil loops arranged such that a current flowing thereon substantially shields a fringe field from the primary coil set when the primary coil set is operating in the first configuration. A second shielding coil set disposed about the primary coil set includes an array of conductive coil loops arranged such that a current flowing thereon substantially shields a fringe field from the primary coil set when the primary coil set is operating in the second configuration.

In still a further aspect, a method of magnetic resonance imaging comprises generating a temporally constant magnetic field through an examination region of a magnetic resonance imaging apparatus, exciting and manipulating magnetic resonance in selected dipoles in the examination region, demodulating magnetic resonance signals received from the examination region, reconstructing the demodulated resonance signals into an image, and, in appropriate time sequence to the above actions, inducing gradient magnetic fields across the temporally constant magnetic field with a gradient coil assembly. The gradient coil assembly comprises a primary gradient coil set disposed about the examination region including an array of conductive coil loops switchable between a first configuration in which a current flowing thereon generates magnetic field gradients which are substantially linear over a first useful imaging volume and a second configuration in which a current flowing therein generates magnetic field gradients which are substantially linear over a second useful imaging volume which is smaller than the first. The gradient coil assembly further includes a first shielding coil set disposed about the primary coil set including an array of conductive coil loops arranged such that a current flowing thereon substantially shields a fringe field from the primary coil set when the primary coil set is operating in the first configuration. A second shielding coil set is disposed about the primary coil set and includes an array of conductive coil loops arranged such that a current flowing thereon substantially shields a fringe field from the primary coil set when the primary coil set is operating in the second configuration.

In yet a further aspect, in a method of magnetic resonance imaging, a method of producing a magnetic field gradient which is generally linear over a selected imaging volume comprises providing a primary gradient coil having a first configuration to produce a first magnetic field gradient in response to supplying current thereto, the first magnetic field gradient being generally linear over a first useful imaging volume. One or more turns of the primary gradient coil are identified which, when electrically decoupled from the primary coil, reconfigures the primary gradient coil to a second configuration to produce a second magnetic field gradient in response to supplying the first current thereto, the second magnetic field gradient being generally linear over a second useful imaging volume. A first shield coil is configured to substantially shield a fringe field from the primary coil when the primary coil set is operating in the first configuration. A second shield coil is configured to substantially shield a fringe field from the primary coil when the primary coil set is operating in the second configuration.

In still another aspect, a method of designing a gradient coil system for a magnetic resonance imaging system having a variable useful imaging diameter spherical volume, comprises designing a primary gradient coil having a first configuration that produces a first magnetic field gradient that is generally linear over a first imaging volume. One or more turns of the primary gradient coil which, when electrically decoupled from the primary gradient coil, reconfigures the primary gradient coil to a second configuration which produces a second magnetic field gradient that is generally linear over a second imaging volume. A first shield coil is designed that produces a magnetic field which substantially cancels in an area outside a region defined by the shielding coil a first fringe magnetic field generated by the primary gradient coil in one of the first and second configurations. A second shield coil is designed that produces a magnetic field, either alone or in combination with the first shield coil, which substantially cancels in an area outside a region defined by the shielding coil a second fringe magnetic field generated by the primary gradient coil in the other of the first and second configurations.

It will be recognized that the term "substantially linear," as used herein, is not intended to preclude small non-linearities or non-uniformities in the gradient fields.

One advantage of the present invention is that gradient fields with linear regions of variable spatial extent can be generated to accommodate both large volume imaging applications and small volume imaging applications requiring fast gradient coil switching and high peak gradient strengths.

Another advantage is that the linear region of the gradients can be tailored to the region of interest, thus reducing the potential for peripheral nerve stimulation in an examination subject.

Another advantage is that pluralities of selectable shield coils are provided for efficient shielding for the selected field of view.

Still further advantages of the present invention will become apparent to those of ordinary skill in the art upon reading and understanding the following detailed description of the preferred embodiments.

BRIEF DESCRIPTION OF THE DRAWINGS

The invention may take form in various steps and arrangements of steps and in various components and arrangements of components. The drawings are only for purposes of illustrating the preferred embodiments and are not to be construed as limiting the invention.

FIG. 6 is a graph of the linearity of the $B_z$ component of the magnetic field as a function of z at $\rho=0$ for the z-gradient primary coil with all coils present to provide a 50 cm DSV, and a subset of coil turns electrically decoupled to provide a 40 cm DSV. Linearity in percent as a function of z is calculated as:

$$100[B_z(r=0,z)-\text{ideal}B_z(r=0,z)]/\text{ideal}B_z(r=0,z).$$

Figure 7:
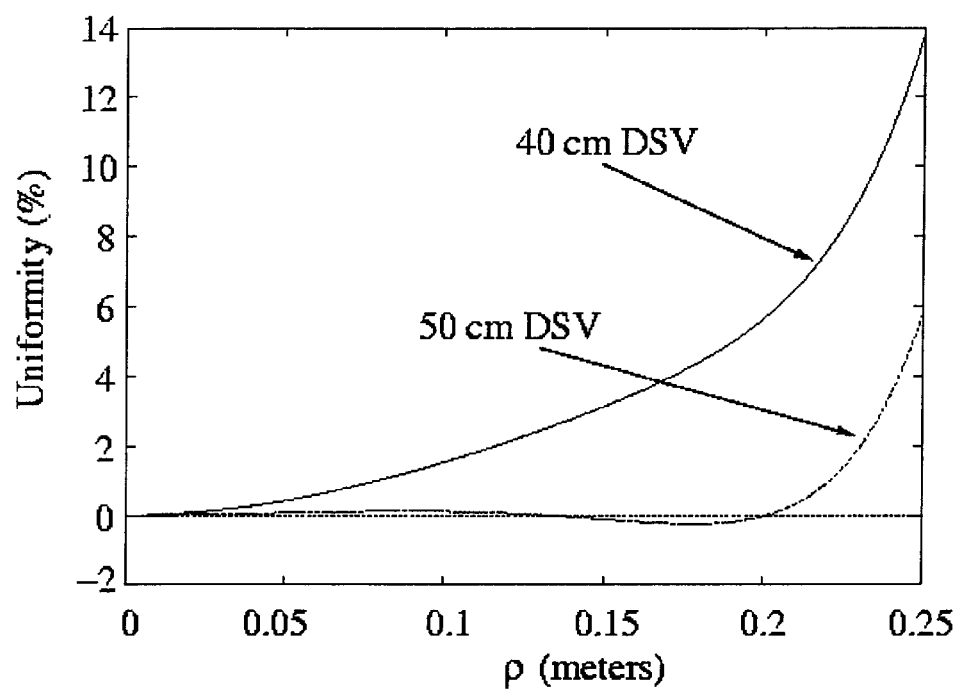

FIG. 7 is a graph of the uniformity of the $B_z$ component of the magnetic field as a function of $\rho$ at z=0.001 m for the z-gradient primary coil with all coils present to provide a 50 cm DSV, and a subset of coil turns electrically decoupled to provide a 40 cm DSV. Uniformity in percent is calculated as $$100[B_z(r,z=0.001)-B_z(r=0,z=0.001)]/B_z(r=0,z=0.001).$$

Figure 8:
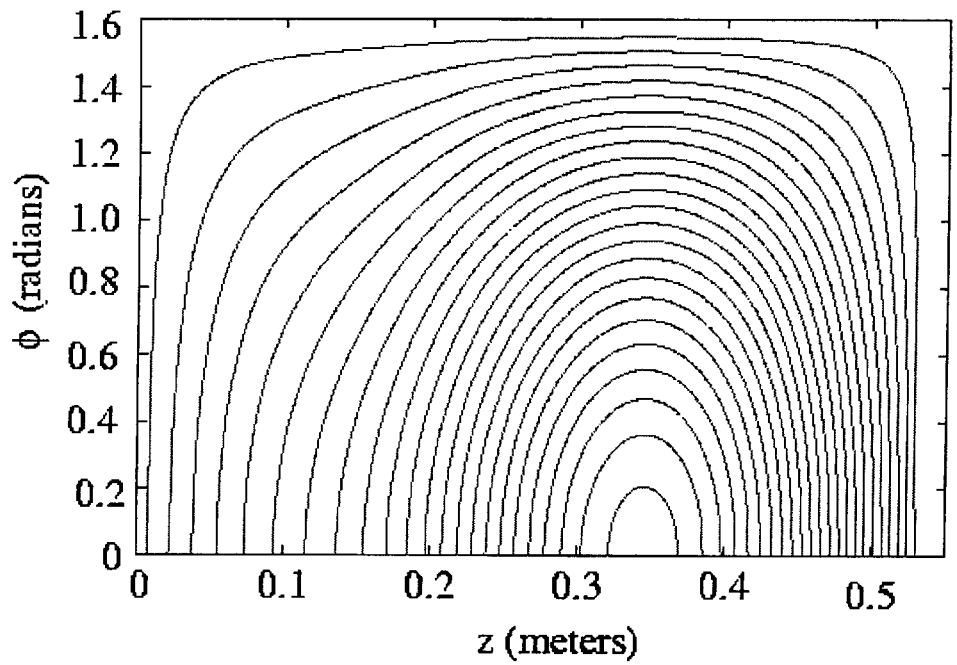

FIG. 8 is a graph showing the current paths on the x-gradient primary coil, with all coils present to provide a 50 cm DSV.

Figure 9:
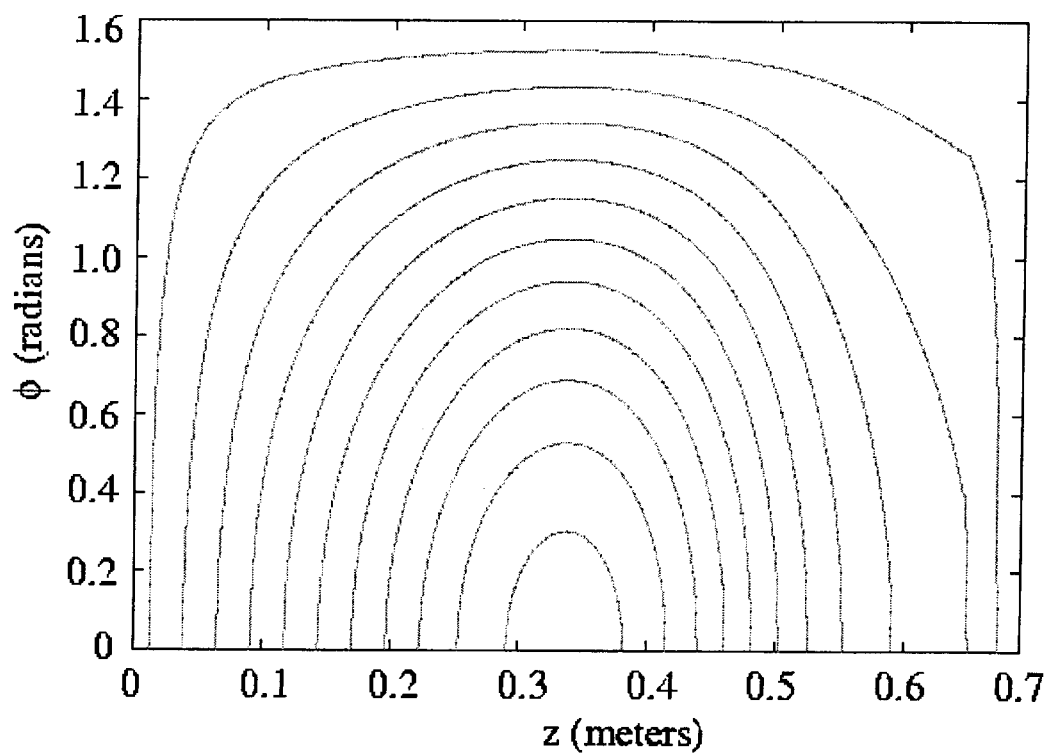

FIG. 9 is a graph showing the current paths on the x-gradient main shield coil, which provides shielding for the primary coil defined in FIG. 8.

Figure 10:
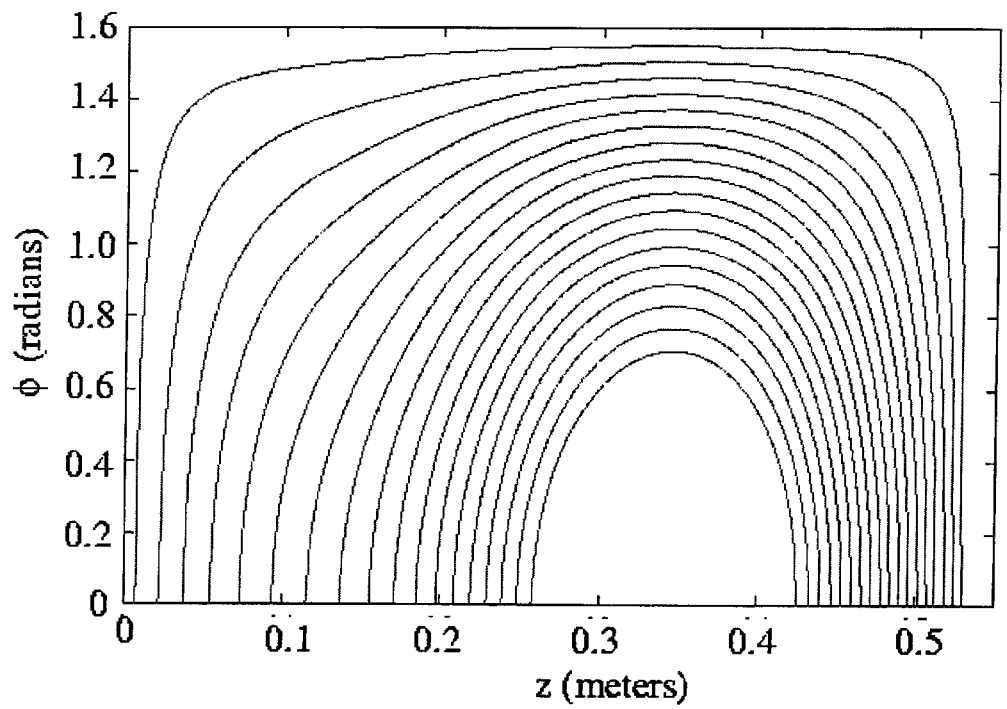

FIG. 10 is a graph showing the current paths on the x-gradient primary coil, with a subset of coil turns eliminated (electrically decoupled) to provide a 40 cm DSV.

Figure 11:
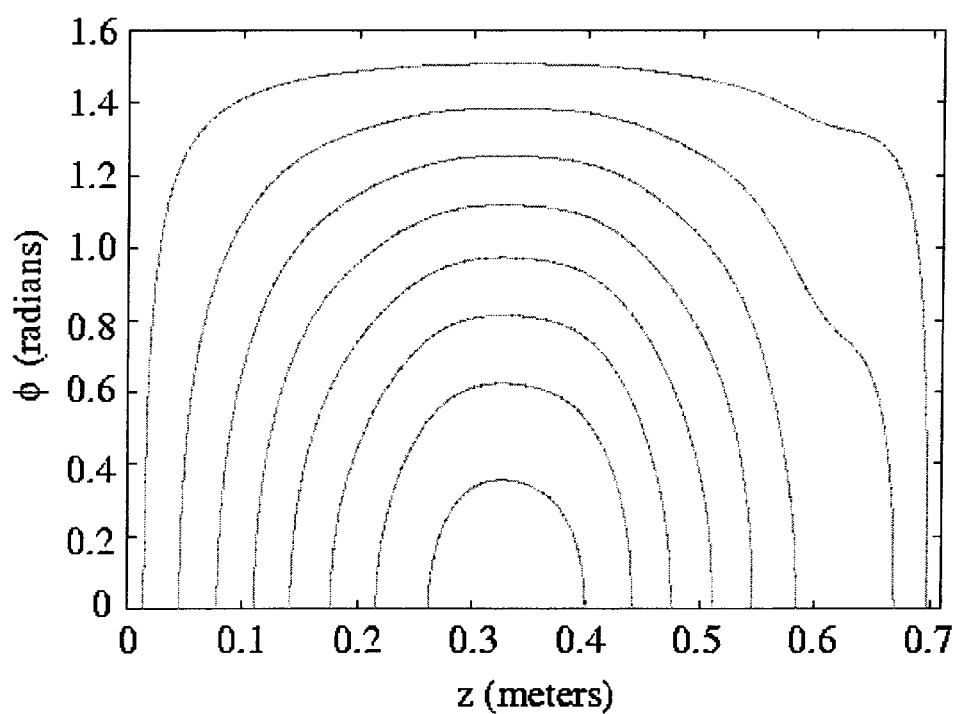

FIG. 11 is a graph showing the current paths on the x-gradient complimentary shield coil (40 cm DSV), which provides shielding for the primary coil defined in FIG. 10.

Figure 12:
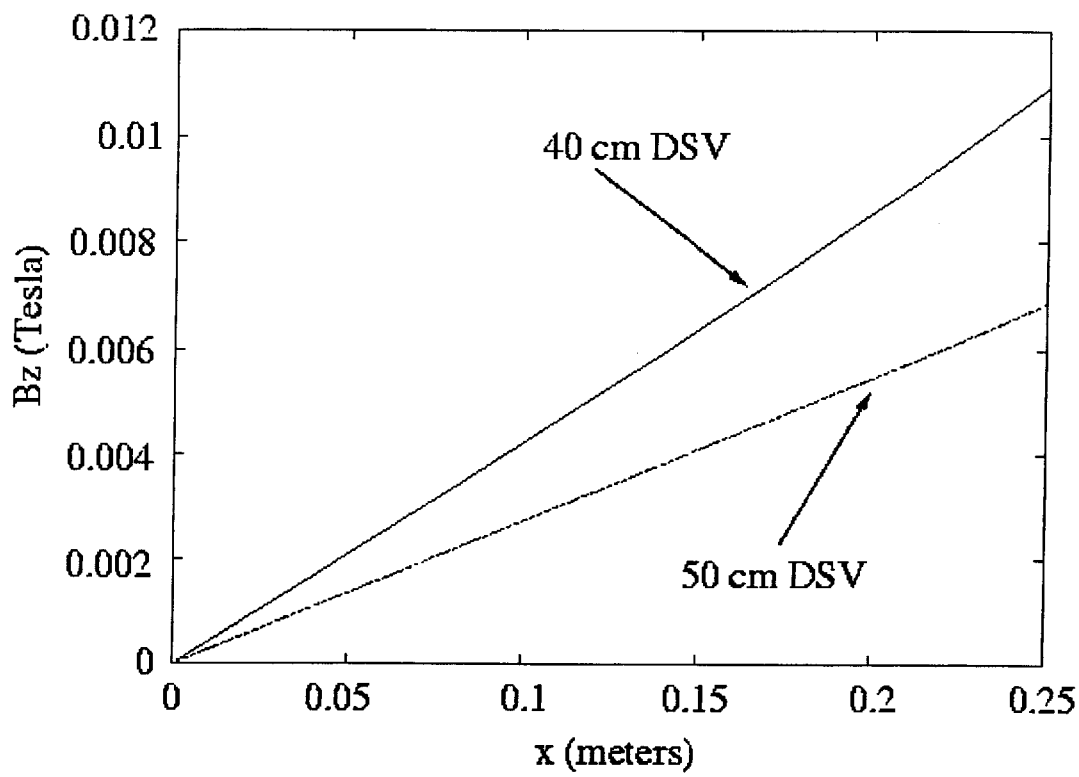

FIG. 12 is a graph of the $B_z$ component of the magnetic field as a function of x at z=0 for the x-gradient primary coil with all coils present to provide a 50 cm DSV, and a subset of coil turns electrically decoupled to provide a 40 cm DSV.

Figure 13:
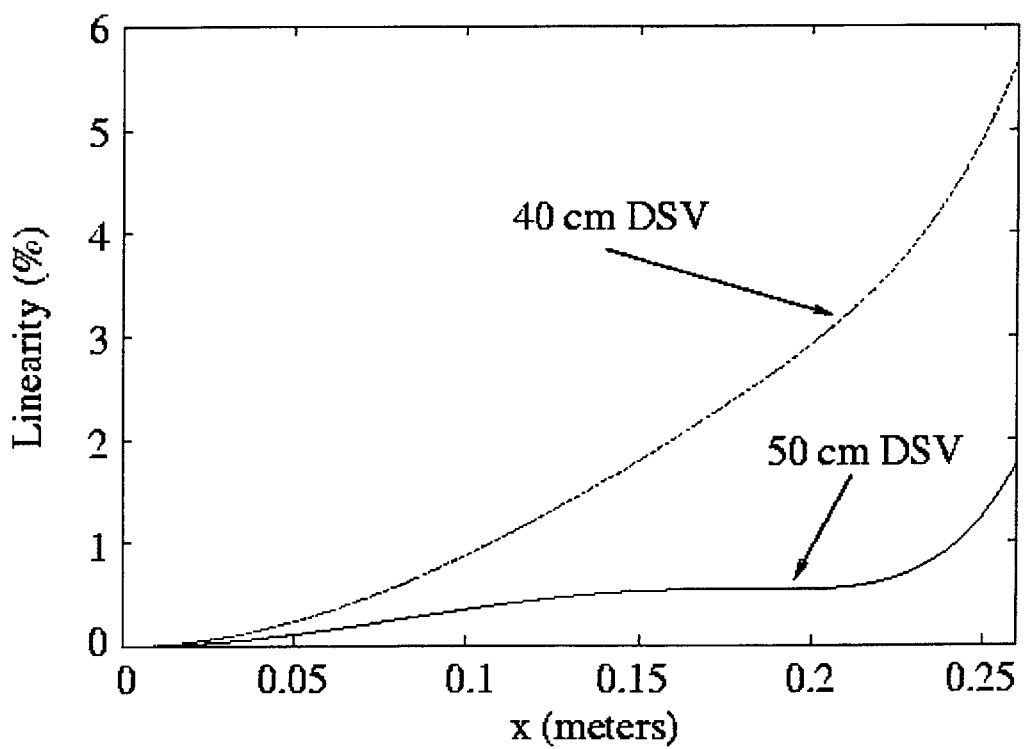

FIG. 13 is a graph of the linearity of the $B_z$ component of the magnetic field as a function of x at z=0 for the x-gradient primary coil with all coils present to provide a 50 cm DSV, and a subset of coil turns electrically decoupled to provide a 40 cm DSV. Linearity in percent is calculated as:

$$100[B_z(x,z=0)-\text{ideal}B_z(x,z=0)]/\text{ideal}B_z(x,z=0).$$

Figure 14:
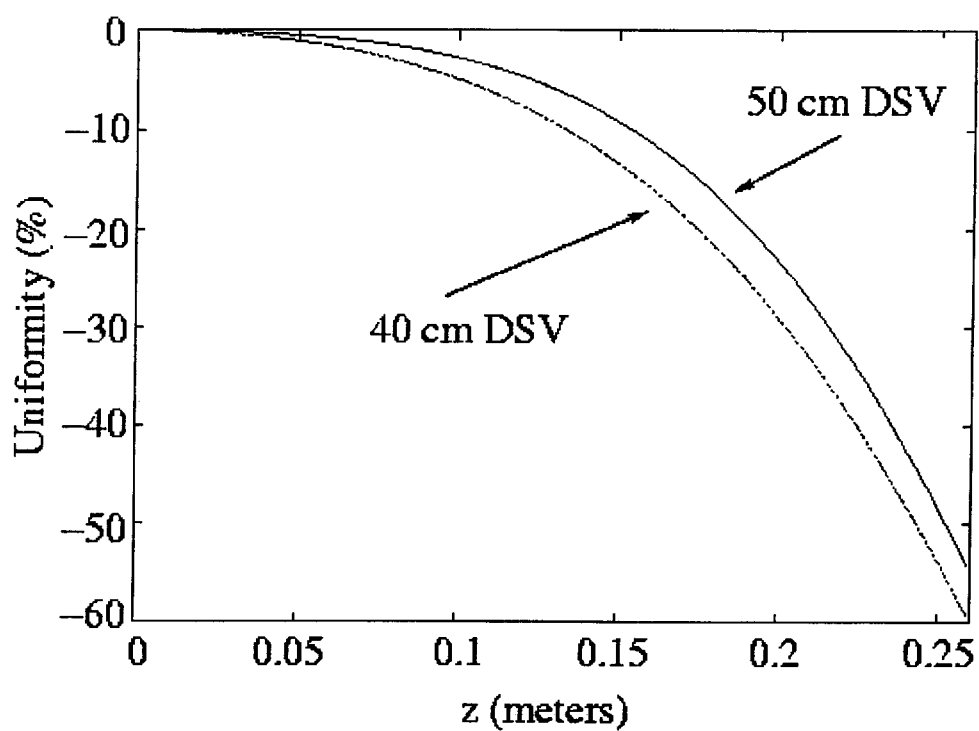

FIG. 14 is a graph of the uniformity of the $B_z$ component of the magnetic field as a function of z at x=0.001 m for the x-gradient primary coil with all coils present to provide a 50 cm DSV, and a subset of coil turns electrically decoupled to provide a 40 cm DSV. Uniformity in percent is calculated as $$100[B_z(x=0.001,z)-B_z(x=0.001,z=100)]/B_z(x=0.001,z=0)$$

Figure 15:
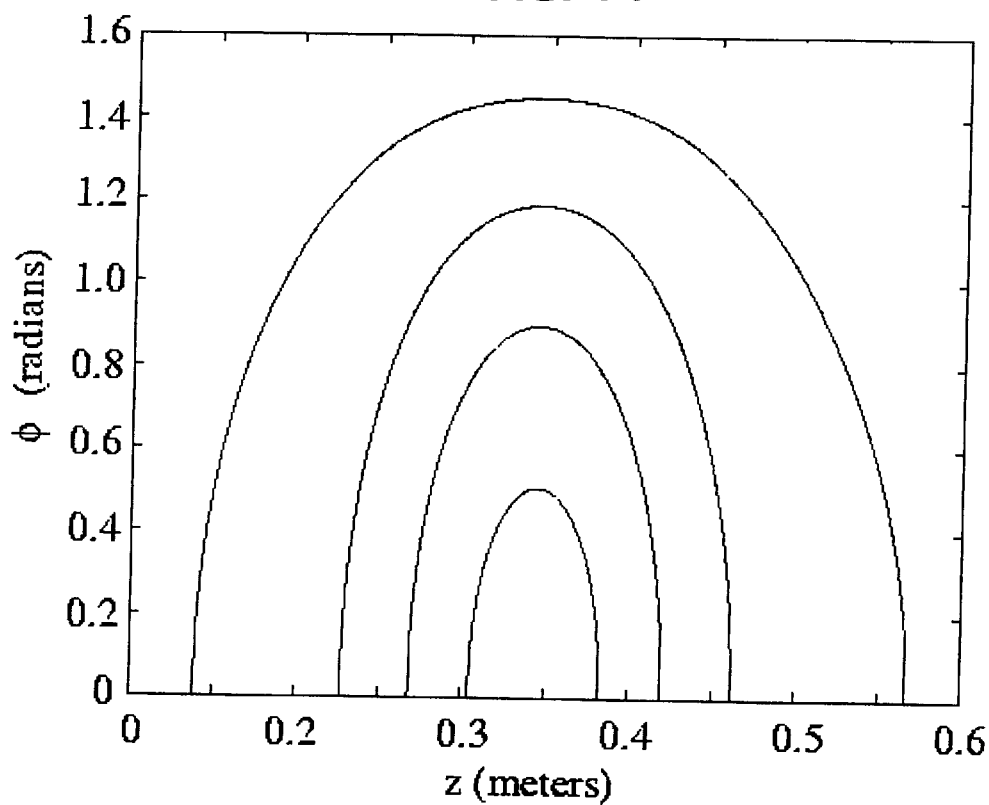

FIG. 15 is a graph showing discrete current patterns for the x-gradient supplemental shield coil of the present invention, which provides shielding for the eliminated (electrically decoupled) turns from the primary coil. The supplemental shield coil can be used in an environment to provide for a continuous variation of the DSV.

DETAILED DESCRIPTION OF THE PREFERRED EMBODIMENTS

Figure 1:
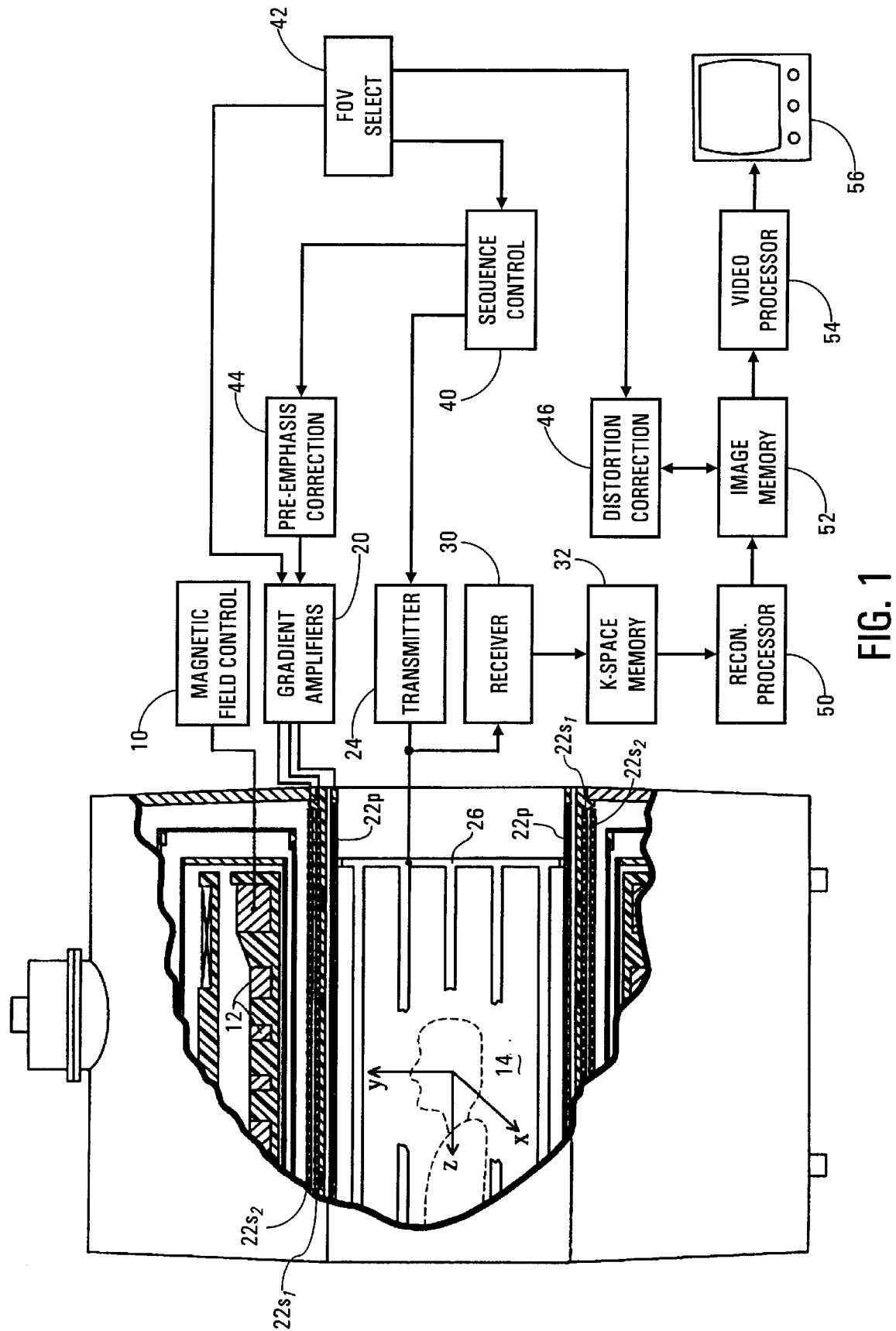
FIG. 1 is a diagrammatic illustration of a magnetic resonance imaging apparatus including a variable FoV gradient coil assembly in accordance with the present invention.

With reference to FIG. 1, a main magnetic field control 10 controls superconducting or resistive magnets 12 such that a substantially uniform, temporally constant main magnetic field $B_0$ is created along a z-axis through an examination region 14. Although a bore-type magnet is illustrated in FIG. 1, the present invention is equally applicable to open magnet systems and other known types of MRI scanners. A couch (not illustrated) suspends a subject to be examined within the examination region 14. A magnetic resonance echo generation system applies a series of radio frequencies (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like, to generate magnetic resonance imaging and spectrography sequences. More specifically, gradient pulse amplifiers 20 apply current pulses to selected ones or pairs of primary gradient coil assemblies 22p and shield gradient coil assemblies 22$s_1$ and/or 22$s_2$ to create magnetic field gradients along x, y, and z axes of the examination region 14. A digital radio frequency transmitter 24 transmits radio frequency pulses or pulse packets to a whole-body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. For whole-body applications, the resonance signals are commonly picked up by the whole-body, or other suitable close-fitting, RF coil 26. For generating images of local regions of the subject, specialized radio frequency coils are placed contiguous to the selected region. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used to only receive resonance signals excited by whole-body coil RF transmissions. The resultant radio frequency signals are picked up by the whole-body RF coil 26, the insertable RF coil, or other specialized RF coils and demodulated by a receiver 30, preferably a digital receiver.

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. Following each RF excitation pulse, the resonance signals are amplified and demodulated by the receiver 30 and sampled into a k-space data memory 32. The received data are reconstructed into an image representation by a reconstruction processor 50 which applies a two-dimensional Fourier transform or other appropriate reconstruction algorithm. The image may represent a planar slice through the patient, an array of parallel planar slices, a three-dimensional volume, or the like. The image is then stored in an image memory 52 where it may be accessed by a video processor 54 that formats the image data for display on a human-viewable display, such as a video monitor 56.

The gradient coil assembly 22 includes, for each of the x, y, and z axes, a primary coil, a first shield coil, and a second shield coil. Switches are provided so that some of the coil windings on the primary coil can be disconnected. The first and second shield coils occupy different radial positions. However, all primary coil turns, i.e., the reduced volume subset and the switchable coils, represent groupings of turns of the same coil and, therefore, have the same radial position. The system of the present invention is cost effective in that it requires only one primary coil per gradient.

In a first embodiment, the primary coil when operated with all coil connected, is shielded by the first shield only to provide a large useful DSV, designated DSV1. By way of example only, a preferred value for DSV1 is about 50 cm. When the primary coil is operated with turns disconnected, the second shield only is used. The turns on the primary coil that can be disconnected are chosen in such a way that the remaining operative subset of coil turns, when used with the second shield coil, cooperate to provide a second useful DSV, designated DSV2, where DSV2<DSV1. As an example only, a preferred value for DSV2 is about 40 cm.

The provision of a single primary coil per axis provides heat dissipation and other benefits since, in shielded gradient coil constructions, about two-thirds of the heat is generated by the primary coil and about one-third by the shield coil. One of the other benefits is that the efficiency of the primary coils is maximized relative to the prior art designs wherein primary coils at different radii are required. When primary coils are placed at increasingly large radii, the efficiency is reduced and heating further increases accordingly This efficiency is achieved on the one hand while maintaining good shielding characteristics on the other.

In a second embodiment, the gradient coil construction 22 comprises a primary coil, a main shield coil, and a supplemental shield coil. The primary coil comprises switchable coils such that a large DSV, e.g., DSV1, is provided when operated with all coils connected. The primary coil with all coils used is shielded by the main shield coil only. The turns on the primary coil that can be disconnected are chosen in such a way that the remaining operative subset of coil turns, together with both the main shield coil and the supplemental shield coil, cooperate to provide a second useful DSV, e.g., DSV2.

The second gradient coil configuration functions as a reduced volume coil, and has a smaller imaging FoV, a higher gradient strength, a higher slew rate, lower stored energy, and the ability to be switched faster, as compared to the initial gradient coil configuration. This reduced volume gradient coil configuration with the smaller useful DSV, DSV2, has certain advantages for imaging anatomy or structures which require a smaller imaging DSV, such as the brain or heart.

In the second embodiment, the supplemental shield coil is a shield coil designed for those turns of the primary coil which can be decoupled. The supplemental shield coil thus provides a correction field to the main shield coil. The supplemental shield coil is of reverse polarity with respect to the main shield coil and provides correction terms that combine with the large DSV main shield to provide a smaller DSV shield, i.e., the combination of the main and supplemental shield coils provides shielding which is complimentary to the primary coil subset providing the smaller DSV. By correcting the main shield, no sacrifice in shielding efficiency is made when switching between the large and small FoVs. Since both the large and small DSV coil configurations are well shielded, eddy current effects are minimized over the possible range of DSVs.

In a third embodiment, the gradient coil assembly 22 again includes, for each of the x, y, and z axes, a primary coil, a main shield coil and a supplemental shield coil, and switches for disconnecting some of the coil windings on the primary coil. The primary coil, when operated with all coils connected, is shielded by the main shield coil in combination with the supplemental shield coil, providing a first useful DSV, DSV1, as above. In this embodiment, the main shield is no longer defined as that which, on its own, provides shielding for the larger DSV configuration.

The turns on the primary coil that can be disconnected are chosen in such a way that the remaining operative subset of coil turns, together with the main shield coil only, cooperate to provide a second, smaller useful DSV, DSV2, as above.

The supplemental shield coil provides a correction field to the main shield coil which is of the same polarity as the main shield coil and provides correction terms that combine with the small DSV main shield to provide a larger DSV shield. That is to say, the main shield is complimentary to the primary coil with turns removed and the combination of the main and supplemental shields is complimentary to the primary coil with all turns used. Again, the main shield coil is corrected so that no sacrifice in shielding efficiency is made when switching between the large and small FoVs. The second gradient coil configuration functions as a reduced volume coil for small FoV applications and has a higher gradient strength and slew rate as compared to the initial gradient coil configuration, providing the advantages as described above.

In each of the above-described embodiments, there are a number of different methods or steps that can be taken to obtain the reduced volume coil design. It is desired, in any of the possible methods, that both the initial coil design and the reduced volume coil design are well shielded to minimize eddy current effects when used over the possible range of DSVs. Target field and energy minimization methods, with constraints, may be used to arrive at main coil solutions. Also, by way of an example, reduced volume primary coil current patterns may be arrived at by elimination of several turns from the primary coil to provide smaller DSV. Particularly, for the transverse gradient coil, it has been observed in accordance with the present invention that higher peak gradient strength can be achieved by eliminating several turns on the main primary coil near its eye. The turns near the eye of the coil add to the overall inductance, but are relatively inefficient at generating gradient strength. This allows increasing the gradient strength without piling up the turns near the edge of the coil.

Figure 2:
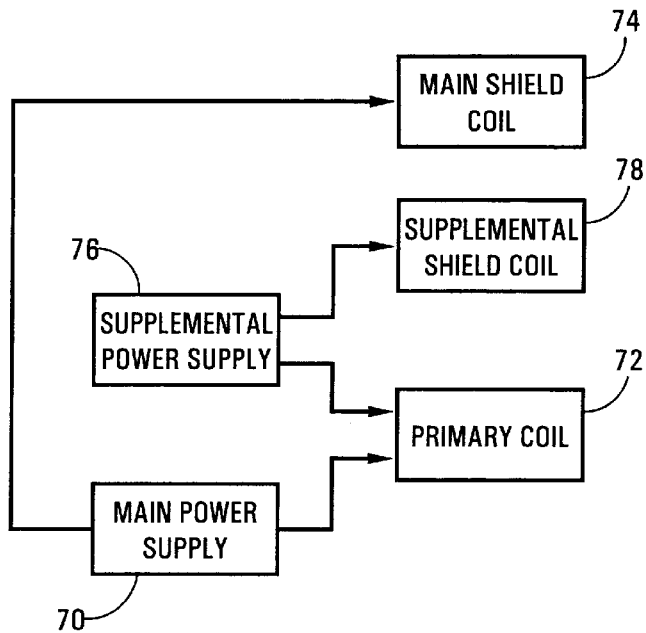
FIGS. 2–4 illustrate exemplary power supply configurations for continuously variable FoV implementations of the present invention.

The first embodiment described above is implemented as a discretely variable FoV design. Each of the above second and third embodiments can be implemented as either a dual FoV design (discretely selectable between DSV1 and DSV2) or a continuously variable FoV design (continuously variable between DSV1 and DSV2). For discretely variable implementations, only a single power supply for driving the coils is required. For continuously variable implementations, a first power supply is used for the primary coil subset and the main shield coil and a second power supply is used for the eliminated primary coil turns and the supplemental shield coil. By varying the current in the removed primary coil turns and the supplemental shield, the FoV can be continuously adjusted. FIG. 2 is a block diagram illustrating a dual power supply configuration. A main power supply 70 drives the primary coil 72 subset and the main shield 74. A supplemental power supply 76 drives the removed turns of the primary coil 72 and the supplemental shield coil 78. By varying the current in the supplemental shield coil 78 and in the removed turns of the primary coil, an efficiently shielded, continuously variable DSV is provided.

Figure 3:
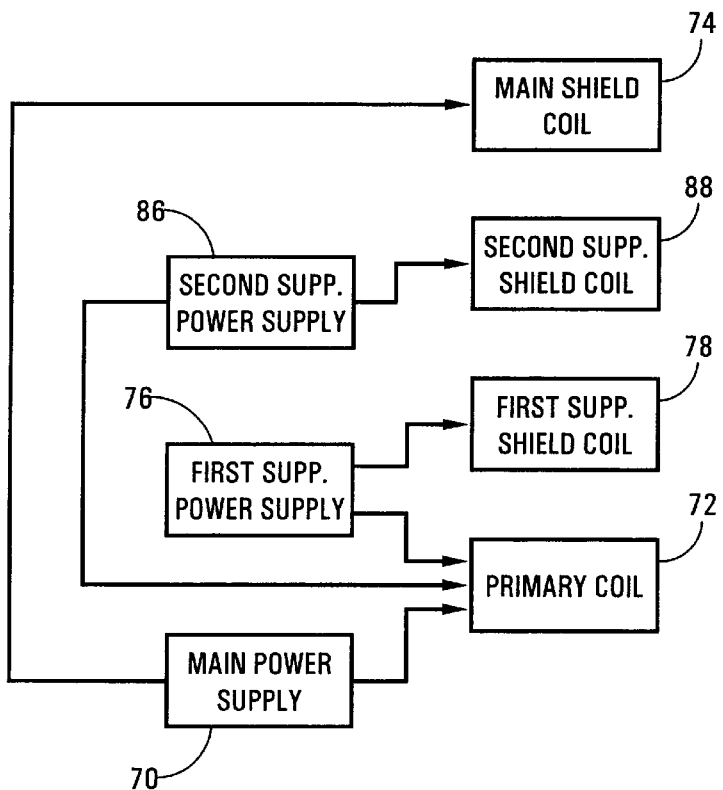

The second and third embodiments described above can be further modified to provide additional selectable DSVs or ranges of continuously variable DSVS. For example, a selectable DSV, designated DSV3, that is smaller than DSV2 is provided by removal of further turns from the primary coil and the provision of a second supplemental shield which is designed for these missing turns. For discretely variable implementations, a single power supply can be used. For continuously variable implementations, three power supplies are required. FIG. 3 is a block diagram illustrating a three power supply configuration. A main power supply 70 drives the primary coil 72 subset and the main shield 74. A first supplemental power supply 76 drives a first set of removed turns of the primary coil 72 and the supplemental shield coil 78. A second supplemental power supply 86 drives a second set of removed turns of the primary coil 72 and a second supplemental shield coil 88. By varying the current in the first and second supplemental shield coils and in the first and second sets of removed turns of the primary coil, a continuously variable DSV is provided.

Figure 4:
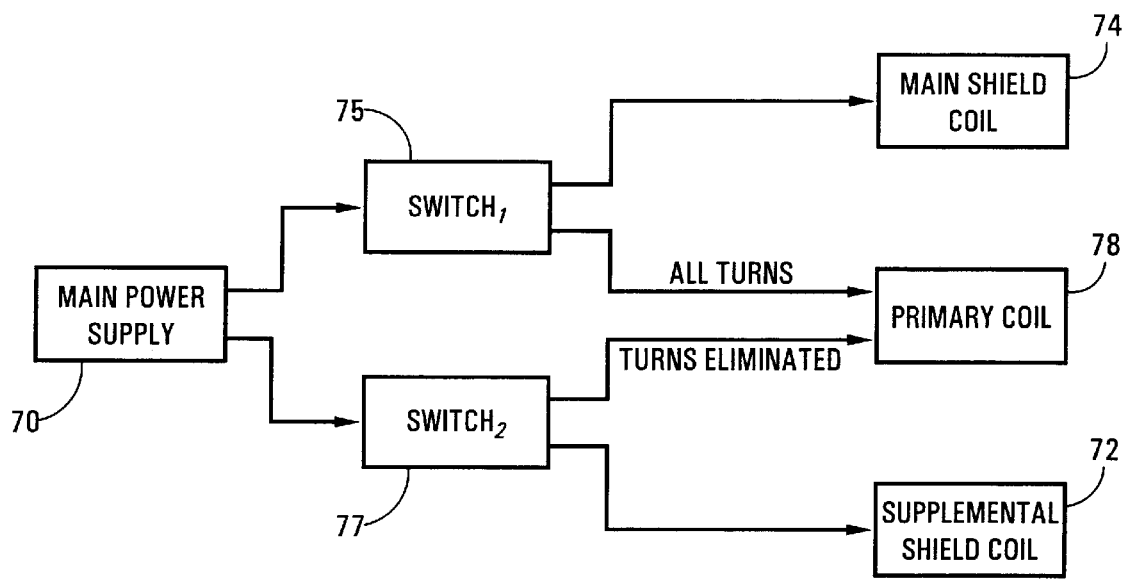

In FIG. 4, a block diagram of a preferred power supply configuration is illustrated. A single power supply 70 is provided and multiple switches are provided for the different DSV configurations. A first switch 75 is used to supply power to the primary coil 72 with all turns connected and the main shield 74. A second switch 77 drives the primary coil 72 having selected turns decoupled and the supplemental shield coil 78. In this manner, efficiently shielded, discretely variable imaging DSV configurations are provided.

In a further alternative embodiment, imaging volumes less than DSV2 can also be provided by reversing the current direction in the eliminated turns. By using a variable amount of reverse polarity current in the selected turns, the useful DSV can be made variable over a range of imaging volumes between DSV2 and some smaller imaging volume, e.g., DSV3, as described above.

In the discretely selectable embodiments, the gradient coil assembly has two fixed DSVs, DSV1 and DSV2, e.g., 50 cm and 40 cm, respectively. The subset of the turns on the primary coil used for DSV2 is used to determine the continuous current distribution on the supplemental shielding coil. By combining the subset of discrete turns on the primary coil and the continuous current distribution on the shielding coil, the field quality characteristics are calculated. This procedure is iterated until the desired field quality is achieved. The final continuous current distribution on the supplemental shield coil is then discretized.

In the first embodiment described above, the entire primary coil and the first shielding coil only are driven in series to provide imaging volume DSV1. When the primary coil having turns disconnected is driven in series with the second shield coil only, an imaging volume DSV2 results.

In the second embodiment described above, the entire primary coil and the main shielding coil only are driven in series to provide imaging volume DSV1. When the primary coil having turns disconnected is driven in series with the main shield coil and the supplemental shield coil, an imaging volume DSV2 results.

In the third embodiment described above, the entire primary coil, the main shielding coil, and the supplemental shielding coil are driven in series to provide imaging volume DSV1. The primary coil having turns disconnected is driven in series with the main shielding coil only to produce imaging volume DSV2.

It is to be noted that, as one skilled in the art may contemplate, there are various discretization and amplifier (power supply) drive alternatives that can be used. We have thus far described the invention in the context of series-connected drive arrangements between a shield coil and its respective primary coil. It may be preferred, particularly for the case of a supplementary shield coil in shielding the electrically decoupled turns of the primary coil wherein only a few turns of the primary coil are decoupled, to discretize the supplementary shield coil using less current per turn or loop than its respective primary coil. This allows for a discretization of the shield coil, which more accurately approximates the respective continuous current distribution and maintains good shielding characteristics. In this approach, one may use an additional power supply to separately feed the supplementary shield coil, or one may use a current splitting scheme whereby not all of the current flowing through the decoupled primary turns is caused to flow through the supplementary shield coil, as would be the case for series connection, but rather only a portion of said current is caused to flow (the balance of the current being diverted by use of an appropriate circuit arrangement).

Figure 5:
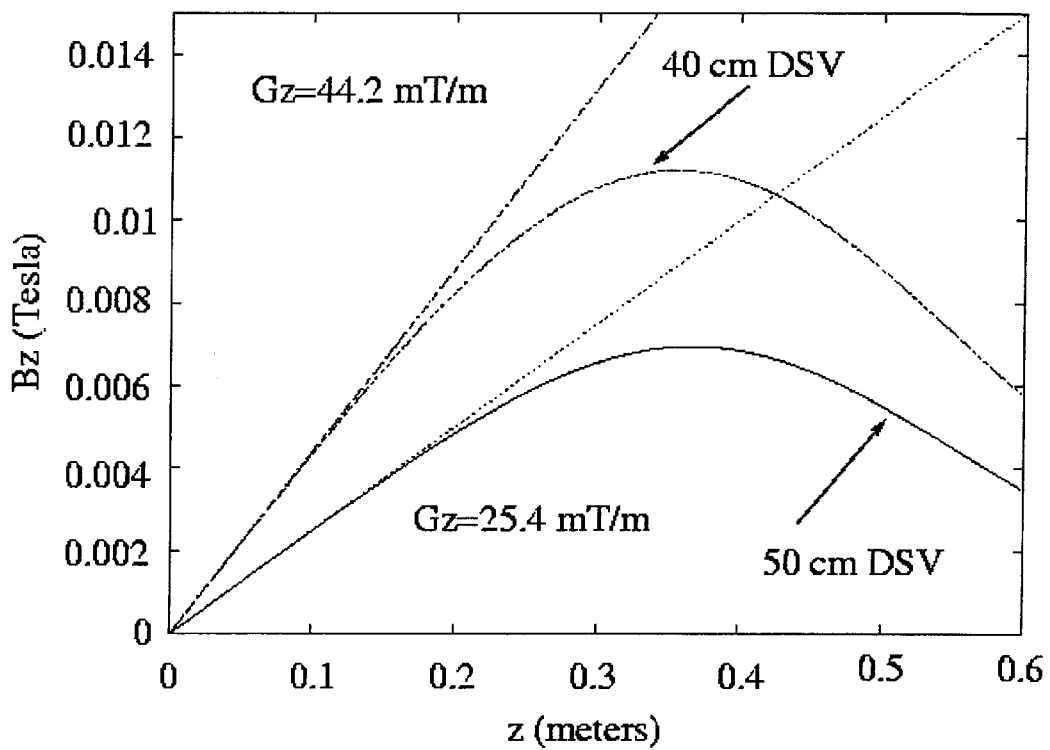
FIG. 5 is a graph of the $B_z$ component of the magnetic field as a function of z at $\rho=0$ for the z-gradient primary coil with all coils present to provide a 50 cm DSV, and a subset of coil turns eliminated, i.e., electrically decoupled, to provide a 40 cm DSV.
Figure 6:
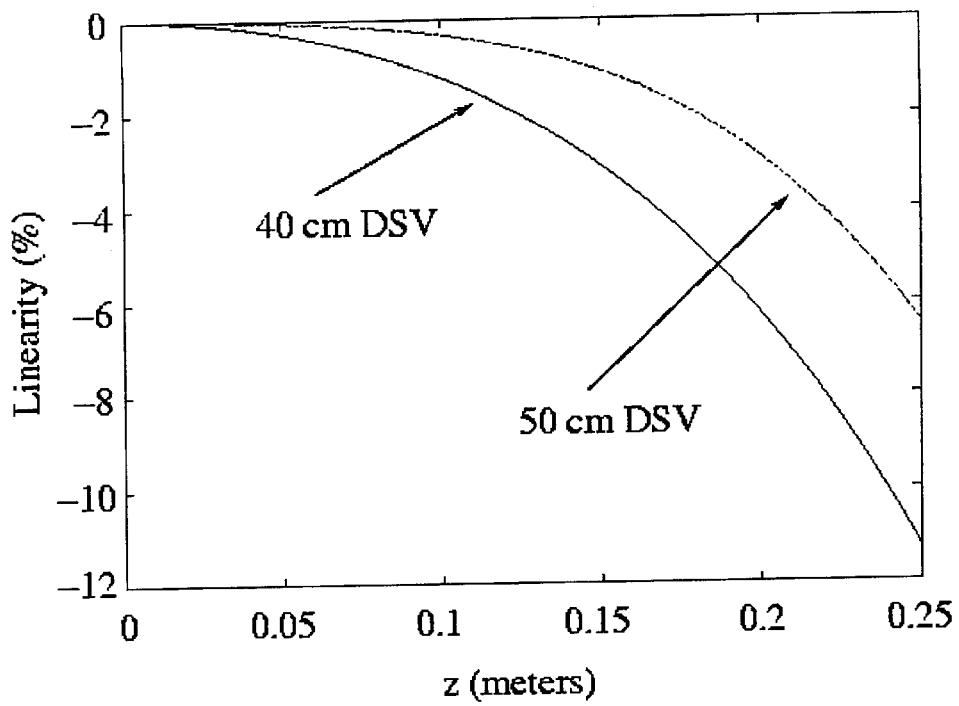

FIG. 5 shows the variation of the $B_z$ field produced by a z-gradient primary coil (DSV1=50 cm) in accordance with the present invention and the z-gradient primary coil with turns removed (DSV2=40 cm). In the depicted example, the primary coil with all turns has about 25.4 mT/m gradient strength when driven with a current of 347.4 A. The primary coil with eliminated turns has about 44 mT/m gradient strength when driven with a current of 500.0 A. At the latter current, the primary coil with all turns used would have about 36.6 mT/m gradient strength. In FIG. 6, the variation of the linearity of the $B_z$ component of the magnetic field as a function of z at $\rho=0.0$ is shown. FIG. 7 shows the variation of the uniformity of the $B_z$ component of the magnetic field as a function of ρ at z=0.001 m. TABLE 1, below, provides a synopsis of FIGS. 5–7.

TABLE 1

Z-Gradient Coil Summary (Rp = 0.356 m, $Rs_1$ = 0.424929 m, $Rs_2$ = 0.446929 m).

| Properties | 50 cm DSV Gradient Coil Configuration | 40 cm DSV Gradient Coil Configuration |
|---|---|---|
| Inductance (μH) | 656.3 | 562.1 |
| Resistance (Ω) for 4 mm × 6 mm Cu | 0.176 | 0.143 |
| Gradient strength (mT/m) @ 500 A | 36.6 | 44 |
| Sensitivity (μT/m/A) | 73.2 | 88 |
| Slew rate @ 1600 V | 160.3 | 225.5 |
| Linearity (%): | | |
| (r,z) = (0, 20 cm) | −2.94 | −6.27 |
| (r,z) = (0, 22.5 cm) | −4.45 | −8.5 |
| (r,z) = (0, 25 cm) | −6.47 | −11.2 |
| Uniformity (%) | | |
| (r,z) = (22.5 cm, 0.1 cm) | +1.35 | +8.29 |
| (r,z) = (25 cm, 0.1 cm) | +5.53 | +13.86 |
| Residual eddy current effect (%) on 50 cm DSV for 50 cm DSV configuration and 40 cm DSV for 40 cm DSV configuration. | <0.3 | <0.31 |

Z-positions of loops for the x-gradient coil are shown in TABLE 2. All Primary Coil currents would be positive and all Shield Coil currents would be negative. Only +z half of the coils are shown, odd-symmetric behavior is used to define the −z half. The 50 cm DSV Gradient Coil Configuration is defined by the Primary Coil combined with Shield Coil #1. The 40 cm DSV Gradient Coil Configuration is defined by the Primary Coil, with the loops marked with an asterisk being electrically decoupled, combined with Shield Coil #2. Primary and respective shields would be driven in series.

TABLE 2

| Primary Coil Z positions Rp = 0.356 m | Shield Coil #1 Z positions $Rs_1$ = 0.424929 m | Shield Coil #2 Z positions $Rs_2$ = 0.446929 m |
|---|---|---|
| 0.0503980 | 0.0825173 | 0.0907114 |
| 0.1038622 | 0.1507183 | 0.1609667 |
| 0.1698288 | 0.1955870 | 0.2072909 |
| 0.2071998 | 0.2286568 | 0.2427942 |
| 0.2305253 | 0.2555577 | 0.2726993 |
| 0.2487710 | 0.2788497 | 0.2994526 |
| 0.2644756 | 0.2998224 | 0.3244265 |
| 0.2786750 | 0.3191986 | 0.3485622 |
| 0.2918757 | 0.3374310 | 0.3726506 |
| 0.3043441 | 0.3548401 | 0.3974294 |
| 0.3162202 | 0.3716868 | 0.4235356 |
| 0.3275745 | 0.3882152 | 0.4516230 |
| 0.3384426 | 0.4046848 | 0.4833351 |
| 0.3488474 | 0.4214057 | 0.5240189 |
| 0.3588127 | 0.4387951 | 0.5959004 |
| 0.3683698 | 0.4574889 | |
| 0.3775584 | 0.4786163 | |
| 0.3864262 | 0.5046359 | |
| 0.3950268 | 0.5427873 | |
| 0.4034180* | 0.6293681 | |
| 0.4116622* | | |
| 0.4198268* | | |
| 0.4279876* | | |
| 0.4362331 | | |
| 0.4446748 | | |
| 0.4534639 | | |
| 0.4628289 | | |

TABLE 2-continued

| Primary Coil Z positions Rp = 0.356 m | Shield Coil #1 Z positions $Rs_1$ = 0.424929 m | Shield Coil #2 Z positions $Rs_2$ = 0.446929 m |
|---|---|---|
| 0.4731641 | | |
| 0.4853136 | | |
| 0.5021334 | | |

Exemplary current loop configurations are shown in FIGS. 8–11, using a transverse (x-gradient) coil as an example. It will be recognized that the design of the y-gradient coil assembly receives the identical treatment as that of the x-gradient coil assembly, and is merely rotated 90° about a central axis. FIG. 8 shows the discrete coil centroid patterns for an exemplary discretization of the x-gradient primary coil in the large DSV (DSV1=50 cm) configuration (all coils used) and FIG. 9 shows the discrete coil centroid patterns for a first x-gradient shield which is complimentary with the large DSV coil configuration illustrated in FIG. 8. The large DSV shield configuration is the main shield coil only in the above-described first embodiment and includes both the main shielding coil and supplemental shielding coil in the above-described second embodiment. Note, as mentioned previously, that in practice, the shields will reside at different radii. In FIGS. 8 and 9, a discretization which gives about 25 mT/m for 376 A was used. The coils provide 50 cm DSV.

FIG. 10 shows the discrete coil centroid patterns for an example discretization of the small DSV (DSV2=40 cm) configuration of the x-gradient primary coil (having turns near the eye removed) and FIG. 11 shows a discretization of a second x-gradient shield complimentary with the primary coil small DSV configuration shown in FIG. 10. In FIGS. 10 and 11, a discretization which gives about 42 mT/m gradient strength for 500 A was used. At this current, the main gradient coil would have about 36 mT/m gradient strength.

FIG. 12 shows a graph of the $B_z$ component of the magnetic field as a function of x at z=0. FIG. 13 shows the linearity of the $B_z$ component of the magnetic field as a function of x at 0. FIG. 14 is a graph of the uniformity of the $B_z$ component of the magnetic field as a function of x at z=0. A synopsis of FIGS. 8–14 is provided below in TABLE 3.

TABLE 3

X-Gradient Coil Summary (Rp = 0.34385 m, $Rs_1$ = 0.435224 m, $Rs_2$ = 0.457503).

| Properties | 50 cm DSV Gradient Coil Configuration | 40 cm DSV Gradient Coil Configuration |
|---|---|---|
| Inductance (μH) | 676.1 | 607.68 |
| Resistance (Ω, 4 mm × 6 mm Cu for primary, 3 mm × 16 mm fom shield) | 0.151 | 0.147 |
| Gradient Strength (mT/m) @ 500 A | 35.97 | 41.70 |
| Sensitivity (μT/m/A) | 71.94 | 83.34 |
| Slew Rate @ 1600 V | 155.5 | 208.00 |
| Linearity (%): | | |
| (x,z) = (0, 20 cm) | +0.5 | +2.9 |
| (x,z) = (0, 25 cm) | +1.25 | +4.9 |
| Uniformity (%) | | |
| (x,z) = (0.1 cm, 20 cm) | −23.0 | −29.0 |
| (x,z) = (0.1 cm, 22.5 cm) | −33.9 | −40.2 |
| (x,z) = (0.1 cm, 25 cm) | −48.4 | −53.0 |

TABLE 3-continued

X-Gradient Coil Summary (Rp = 0.34385 m, Rs$_1$ = 0.435224 m, Rs$_2$ = 0.457503).

| Properties | 50 cm DSV Gradient Coil Configuration | 40 cm DSV Gradient Coil Configuration |
|---|---|---|
| Residual eddy current effect on 50 cm DSV for 50 cm DSV configuration and 40 cm DSV for 40 cm DSV configuration. | <0.3 | <0.3 |

In the continuously variable implementations of the present invention, the eliminated turns on the primary coil are used to find the continuous current distribution on the supplemental shield such that, together with the reduced volume (e.g., DSV2=40 cm) primary coil and the large volume (e.g., DSV1=50 cm) shield, the eddy current effects are minimized within reduced volume. This continuous current distribution is then discretized with a certain amount of current, designated I$_{S2}$. A continuous variation of the current on the eliminated turns on the primary coil and, consequently the current I$_{S2}$, allows, together with the large DSV gradient coil set, a continuous variation of the gradient strength and the useful imaging volume. FIG. 15 shows discrete current patterns for the transverse supplemental shield coil, according to an exemplary embodiment of the present invention.

Referring again to FIG. 1, a DSV selection means 42 is provided to allow the operator to select the FoV. This is performed, for example, during a "pilot" or "adjustment" procedure performed prior to a given scanning experiment. The DSV selection is made by an operator through a user interface of a type through which other scanning parameters, such as those affecting contrast, resolution, and so forth, are input as well. In this manner, the DSV characteristic of the gradient coil is tailored to the anatomy or region being imaged. Preferably, the field of view is also adjustable during a scan. Also, data can be acquired for two or more fields of view, e.g., wide area and zoom FoVs, in an interleaved manner.

One method of enhancing image quality in MR imaging applications is through the use of distortion correction which compensates for gradient non-linearities, e.g., performed in software on the resultant images. The distortion correction depends on the gradient coil characteristics. However, with a discretely or continuously variable FoV gradient coil in accordance with the present invention, such gradient coil characteristics tend to vary in accordance with the selected FoV. Thus, in a preferred embodiment, a variable electronic image distortion correction algorithm is utilized. Spherical harmonics, a Taylor expansion series, or the like, is used to describe the image distortion due to the gradient coil characteristics. The coefficients or model for the correction are based on the measured or calculated characteristics of the large and small volume configurations of the primary coil with respective shields. In the continuously variable implementation, the correction factors vary depending on how much of the small volume subset and the switched coil subset are used, which depends on the FoV or imaging DSV being used, which in turn depends on the specific imaging procedure or anatomy. Thus, an optional variable or adaptive distortion correction processor 46 is advantageously provided to correct for gradient distortion characteristics which vary as a function of the selected DSV.

The gradient non-linearity and/or non-uniformity characteristics over the discrete or continuous range of imaging volumes are measured or calculated in advance. The data obtained are used for correction of the reconstructed image data. For example, distortion correction coefficients/models over the selectable DSV range are precalculated and stored for later use in a look-up table preprogrammed in accordance with the coil winding used and the amounts of current in the turns comprising the small volume subset and in the switchable/variable coil turns. The distortion corrections can also be calculated on-the-fly after the image data to be corrected is collected.

Another method for improving image quality is to provide eddy current correction. Because transient gradient techniques are typically used, magnetic couplings are produced between the gradient coils and nearby conductive materials, such as conductive structures of the imaging apparatus. Such magnetic couplings produce eddy current induced residual fields, which degrade the gradient magnetic field. Typically, a pre-emphasis filter is employed to predistort the current pulse such that the amplified current pulse together with the eddy current effects produces the desired output field. Eddy current effects typically vary with spatial position within the imaging DSV, e.g., the optimum eddy current correction over the brain will generally be different than the optimal eddy current correction at the shoulder. Thus, it is possible to use different eddy current corrections based on where the anatomy is located within the DSV. However, in the case of the variable FoV gradient coils of the present invention, it is advantageous to further allow for different eddy current corrections over the same anatomy or spatial position based on the eddy current characteristics of the selected DSV. Accordingly, in a preferred embodiment, an optional pre-emphasis correction circuit 44 is provided in which the precompensation of the gradient is selected based on the amount of current in the primary coil small volume subset of turns and the switchable/variable coil windings. The pre-compensation is based on a priori knowledge of eddy current characteristics over the discrete or continuous DSV range, and is modified based on the selected DSV and other factors, such as offset of the FoV. Although shielding reduces the eddy current effects by reducing the coupling between the transient current and the structures in which the eddy currents are induced, eddy current corrections are advantageously employed even in well-shielded designs, especially for very sensitive imaging techniques such as fat saturation, fast spin echo, echo planar imaging, and the like.

While the adjustable coil system has been described by way of reference to the preferred embodiments, it is to be appreciated that various other options and configurations are also contemplated. For example, the present invention has been described primarily in reference to the well-shielded case in which the shielding is adapted in accordance with the selected DSV. However, there may be cases where one or both primary coil configurations are unshielded. Also, gradient coil assemblies of various sizes, lengths, and geometric configurations may be designed to meet the constraints of numerous applications. The primary coil, main shield coil, or supplemental shield coil may be of equal length or of different lengths.

Each of the embodiments described herein can be modified so that the primary coil having switchable turns eliminated is designed to provide the larger useful imaging volume, DSV1. In the discretely variable case, the polarity of the switched turns is such that when current is provided to all primary coils, including the switchable turns, the primary coil provides the smaller useful imaging volume, DSV2. By varying the current in the switchable turns and the supplemental shield, e.g., by using a supplemental power supply, a continuously variable field of view is provided.

Systems employing more than two discretely selectable DSVs are also contemplated. For ultra-high gradient strengths, coil windings on the primary coil are selectively switchable to provide a third (or more) primary coil turn groupings or subsets to provide a third useful DSV, designated DSV3, wherein DSV3<DSV2, e.g., to allow for yet greater switching rates. A corresponding three (or more) shield coils can be provided to provide shielding for each selectable subset of coil windings. For example, a third shield, which is complimentary to a third coil turn subset of the primary coil is provided and operated when DSV3 is selected. Alternately, the third shield can provide a correction to the one or both of the other shields. By way of non-limiting example, a preferred value for DSV3 is about 30 cm.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance imaging apparatus comprising:

a main magnet system for generating a main magnetic field through an examination region;

a radio frequency coil disposed adjacent the examination region for transmitting radio frequency signals into the examination region and selectively exciting dipoles disposed therein;

a radio frequency transmitter for driving the radio frequency coil;

a receiver which receives magnetic resonance signals from resonating dipoles within the examination region;

an image processor which reconstructs an image representation from the received magnetic resonance signals for display on a human readable display; and a gradient coil assembly for generating magnetic field gradients across the main magnetic field, the gradient coil assembly including:

a primary gradient coil set disposed about the examination region including an array of conductive coil loops which are switchable between a first configuration in which a current flowing thereon generates magnetic field gradients which are substantially linear over a first useful imaging volume and a second configuration in which a current flowing therein generates magnetic field gradients which are substantially linear over a second useful imaging volume which is smaller than the first;

a first shielding coil set disposed about the primary coil set including an array of conductive coil loops arranged such that a current flowing thereon substantially shields a fringe field from the primary coil set when the primary coil set is operating in the first configuration; and a second shielding coil set disposed about the primary coil set including an array of conductive coil loops arranged such that a current flowing thereon substantially shields a fringe field from the primary coil set when the primary coil set is operating in the second configuration.

2. The apparatus of claim 1, wherein the second shielding coil set is disposed about the first shielding coil set.

3. The apparatus of claim 1, further including:

a switch for selectively switching the primary coil set electrically in series with i) the first shielding coil set and ii) one of the second shielding coil set and a combination of the first and second shielding coil sets.

4. The apparatus of claim 1, further including:

a power supply and switching circuitry for supplying current to the primary coil set and the first and second shielding coil sets.

5. The apparatus of claim 1, further including:

a first power supply for supplying current to a first group of coil turns of the primary coil set and the first shielding coil set; and a second power supply for supplying current to a second group of coil turns of the primary coil set and the second shielding coil set.

6. The apparatus of claim 5, wherein the second useful imaging volume is continuously variable in response to varying the amount of current supplied to said second group of coil turns and the second shielding coil set.

7. The apparatus of claim 6, further comprising:

a user interface permitting selection of an imaging field of view; and a sequence controller automatically varying the amounts of current supplied the second power supply in response to the selected field of view to produce magnetic field gradients which are substantially linear over a spatial extent substantially matching the selected field of view.

8. The apparatus of claim 1, further comprising one or both of:

an image distortion correction means for correcting a reconstructed image representation in accordance with identified spatial non-uniformities in the magnetic field gradients, the non-uniformities varying in accordance with a selected imaging volume; and a pre-emphasis correction means which compensates for temporal distortions in a gradient energization profile attributable to eddy currents induced by the gradient energization profile, the pre-emphasis correction adaptive to a selected imaging volume.

9. A gradient coil assembly for inducing magnetic field gradients across an examination region in a magnetic resonance imaging apparatus of the type including a magnet for generating a temporally constant magnetic field through the examination region, the gradient coil assembly comprising:

a primary gradient coil set disposed about the examination region including an array of conductive coil loops which are switchable between a first configuration in which a current flowing thereon generates magnetic field gradients which are substantially linear over a first useful imaging volume and a second configuration in which a current flowing therein generates magnetic field gradients which are substantially linear over a second useful imaging volume which is smaller than the first;

a first shielding coil set disposed about the primary coil set including an array of conductive coil loops arranged such that a current flowing thereon substantially shields a fringe field from the primary coil set when the primary coil set is operating in the first configuration; and a second shielding coil set disposed about the primary coil set including an array of conductive coil loops arranged such that a current flowing thereon substantially shields a fringe field from the primary coil set when the primary coil set is operating in the second configuration.

10. A method of magnetic resonance imaging, comprising:

generating a temporally constant magnetic field through an examination region of a magnetic resonance imaging apparatus;

exciting and manipulating magnetic resonance in selected dipoles in the examination region;

demodulating magnetic resonance signals received from the examination region;

reconstructing the demodulated resonance signals into an image; and inducing gradient magnetic fields across the temporally constant magnetic field with a gradient coil assembly comprising:

a primary gradient coil set disposed about the examination region including an array of conductive coil loops which are switchable between a first configuration in which a current flowing thereon generates magnetic field gradients which are substantially linear over a first useful imaging volume and a second configuration in which a current flowing therein generates magnetic field gradients which are substantially linear over a second useful imaging volume which is smaller than the first;

a first shielding coil set disposed about the primary coil set including an array of conductive coil loops arranged such that a current flowing thereon substantially shields a fringe field from the primary coil set when the primary coil set is operating in the first configuration; and a second shielding coil set disposed about the primary coil set including an array of conductive coil loops arranged such that a current flowing thereon substantially shields a fringe field from the primary coil set when the primary coil set is operating in the second configuration.

11. The method of claim 10, wherein the step of inducing gradient magnetic fields includes applying a current to one of:

a first group of coil turns of the primary coil set and the first shielding coil set;

a second group of coil turns of the primary coil set and the second shielding coil set; and the second group of coil turns of the primary coil set, and the first and second shielding coil sets.

12. In a method of magnetic resonance imaging, a method of producing a magnetic field gradient which is generally linear over a selected imaging volume, comprising:

providing a primary gradient coil having a first configuration to produce a first magnetic field gradient in response to supplying current thereto, the first magnetic field gradient being generally linear over a first useful imaging volume;

identifying one or more turns of the primary gradient coil which, when electrically decoupled from the primary coil, reconfigures the primary gradient coil to a second configuration to produce a second magnetic field gradient in response to supplying the first current thereto, the second magnetic field gradient being generally linear over a second useful imaging volume;

configuring a first shield coil to substantially shield a fringe field from the primary coil when the primary coil set is operating in the first configuration; and configuring a second shield coil to substantially shield a fringe field from the primary coil when the primary coil set is operating in the second configuration.

13. The method of claim 12, further comprising:

selecting one of the first and second imaging volumes;

in response to the first imaging volume being selected, providing current to the primary coil, said primary coil being in the first configuration, and the first shield coil; and in response to the second imaging volume being selected, providing current to the primary coil, said primary coil being in the second configuration, and one of i) the second shield coil, and ii) the first and second shield coils.

14. The method of claim 12, further comprising:

selecting one of the first and second imaging volumes;

in response to the first imaging volume being selected, providing current to the primary coil, said primary coil being in the first configuration, and one of i) the first shield coil, and ii) the first and second shield coils; and in response to the second imaging volume being selected, providing current to the primary coil, said primary coil being in the second configuration, and the second shield coil.

15. The method of claim 12, further comprising:

selecting an imaging volume between the first and second imaging volumes;

electrically decoupling said identified coils from the primary coil and providing a first current to the primary coil and the first shield coil;

selecting a second current which varies in accordance with the selected imaging volume;

providing the second current to said electrically decoupled coils and the second shield coil.

16. The method of claim 12, further comprising:

applying current pulses in variable amounts to generate a plurality of gradient magnetic fields which are substantially linear over a plurality of useful imaging volumes; and mapping or calculating resultant gradient field non-uniformities in the plurality of imaging volumes to generate at least one of: i) a plurality of correction maps, and ii) a plurality of correction coefficients.

17. The method of claim 16, further comprising:

reconstructing an image representation of a selected imaging volume;

selecting a one of the correction maps or correction coefficients which corresponds to the selected imaging volume; and correcting the reconstructed image representation with the selected correction map or correction coefficients.

18. The method of claim 16, wherein the correction maps or correction coefficients are calculated from a combination of corresponding correction maps or correction coefficients for each gradient magnetic field.

19. The method of claim 12, further comprising:

applying current pulses in variable amounts to generate a plurality of magnetic field gradients which are substantially linear over a plurality of useful imaging volumes;

determining eddy current effects in the plurality of imaging volumes;

calculating a plurality of pre-emphasis corrections; and applying a one of the pre-emphasis corrections which corresponds to the selected imaging volume to the current pulses.

20. The method of claim 19, wherein the eddy current effects are determined by measuring the eddy current effects, calculating the eddy current effects, or both.

21. The method of claim 19, wherein the pre-emphasis corrections are calculated from a combination of corresponding pre-emphasis corrections for each gradient magnetic field.

22. A method of designing a gradient coil system for a magnetic resonance imaging system having a variable useful imaging volume, comprising:

designing a primary gradient coil having a first configuration that produces a first magnetic field gradient that is generally linear over a first imaging volume;

identifying one or more turns of the primary gradient coil which, when electrically decoupled from the primary gradient coil, reconfigures the primary gradient coil to a second configuration which produces a second magnetic field gradient that is generally linear over a second imaging volume;

designing a first shield coil that produces a magnetic field which substantially cancels in an area outside a region defined by the shielding coil a first fringe magnetic field generated by the primary gradient coil in one of the first and second configurations;

designing a second shield coil that produces a magnetic field, either alone or in combination with the first shield coil, which substantially cancels in an area outside a region defined by the shielding coil a second fringe magnetic field generated by the primary gradient coil in the other of the first and second configurations.

* * * * *